(12) United States Patent
Ho et al.

(10) Patent No.: US 6,569,584 B1
(45) Date of Patent: May 27, 2003

(54) METHODS AND STRUCTURES FOR PROTECTING RETICLES FROM ELECTROSTATIC DAMAGE

(75) Inventors: Jonathan J. Ho, Fremont, CA (US); Xin X. Wu, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 40 days.

(21) Appl. No.: 09/895,538

(22) Filed: Jun. 29, 2001

(51) Int. Cl.[7] .................................................. G03F 9/00

(52) U.S. Cl. ........................................................ 430/5

(58) Field of Search ............................ 430/5, 296, 322; 438/281; 257/355

(56) References Cited

U.S. PATENT DOCUMENTS 5,989,754 A * 11/1999 Chen et al. ..................... 430/5
6,096,609 A *  8/2000 Kim et al. ................... 438/281
6,365,303 B1 *  4/2002 Hung et al. ..................... 430/5

* cited by examiner

Primary Examiner—S. Rosasco
(74) Attorney, Agent, or Firm—Patrick T. Bever; Edel M. Young

(57) ABSTRACT

A reticle (mask) that is modified to prevent bridging of the masking material (e.g., chrome) between long mask lines of a lithographic mask pattern during an integrated circuit fabrication process. A dummy mask pattern is provided on the reticle adjacent to long mask lines that causes the large charge collected on the long mask line to be distributed along its length, thereby minimizing voltage potentials across a gap separating the long mask line from an adjacent mask line.

28 Claims, 5 Drawing Sheets

METHODS AND STRUCTURES FOR PROTECTING RETICLES FROM ELECTROSTATIC DAMAGE

FIELD OF THE INVENTION

The present invention relates to the fabrication of integrated circuits, and more particularly to reticles (masks) used during the fabrication of integrated circuits.

RELATED ART

Integrated circuit (IC) design typically utilizes computer simulation tools to help create a circuit schematic, which typically includes individual devices that are coupled together to perform a certain function. To actually fabricate an IC that performs this function, the circuit schematic must be translated into a physical representation known as a layout using computer-aided design (CAD) tools. The layout translates the discrete circuit elements of the circuit schematic into shapes that are used to construct the individual physical components of the circuit, such as gate electrodes, field oxidation regions, diffusion regions, and metal interconnections.

CAD tools that generate the layout are usually structured to function under a set of predetermined design rules in order to produce a functional circuit. These design rules are often determined by certain processing and design limitations defined by the particular IC fabrication process in which the layout is to be used, such as design rules defining the minimum space tolerance between devices or interconnect lines that prevent undesirable interaction between devices or lines. Design rule limitations are frequently referred to as critical dimensions. For example, a critical dimension of a circuit is commonly defined as the smallest width of a metal line or the smallest space between metal lines that can be supported by an IC fabrication process. Consequently, the critical dimension determines the overall size and density of the IC.

The layout is optically transferred onto a semiconductor substrate using a series of lithographic reticles (masks) and an exposure tool. Photolithography is a well-known process for transferring geometric shapes (mask pattern portions) present on each reticle onto the surface of a semiconductor substrate (e.g., a silicon wafer) using the exposure tool (e.g., an ultra-violet light source). In the field of IC lithographic processing, a photosensitive polymer film called photoresist is normally applied to the wafer and then allowed to dry. The exposure tool is utilized to expose the wafer with the proper geometrical mask patterns by transmitting UV light or radiation through the reticles. After exposure, the wafer is treated to develop the mask images transferred to the photosensitive material. These masking images are then used to create the device features of the circuit.

An important limiting characteristic of an exposure tool is its resolution value. The resolution value for an exposure tool is defined as the minimum mask pattern feature that the exposure tool can repeatedly expose onto the wafer. As the critical dimensions defined by IC fabrication processes grow ever smaller, the resolution values of features formed on the reticles used to fabricate ICs in accordance with the IC fabrication processes become correspondingly smaller.

While critical dimensions of IC features continue to shrink, the complexity and, hence, the overall size of many modern ICs continues to increase. These complex IC structures often require conductive (e.g., metal) lines for connecting various regions of the IC structure that are both long and narrow (i.e., having widths defined by the critical dimension of IC fabrication process utilized to produce the complex IC). To produce these long, narrow conductive lines, reticles are needed with correspondingly long and narrow mask lines.

FIG. 1 is an exploded perspective view showing a simplified conventional reticle 100 that is used during the optical transfer of long, narrow lines onto a semiconductor substrate (e.g., a wafer) 120. Reticle 100 includes an opaque masking material (e.g., chrome) that is deposited on a transparent (e.g., glass) plate 105 and etched to form a lithographic mask pattern 110. In the present example, mask pattern 110 includes a relatively long first mask line 111, a relatively long second mask line 113 that is perpendicular to first mask line 111 and has an end 113A that is separated from first mask line 111 by a gap 115. In addition, mask pattern 110 may include additional mask structures, such as mask line 117 and mask line 119, also shown in FIG. 1. Note however, that the present invention is particularly directed to reticles on which these additional mask structures are significantly separated from elongated mask lines 111 and 113 for reasons that will become apparent below. Note that the depicted lengths, widths, and thicknesses of lines 111, 113 and 117 in FIGS. 1 and 2 are modified for descriptive purposes.

As depicted in FIG. 1, during an integrated circuit fabrication process, ultra-violet (UV) light or radiation emitted from an exposure tool (not shown) is transmitted through reticle 100, thereby forming an image 122 of mask pattern 110 on semiconductor substrate 120. As indicated by the tapered dashed lines in FIG. 1, the lithographic process typically utilizes an optical reduction system such that image 122 is substantially smaller than (e.g., ¼) the size of lithographic mask pattern 110. Image 122 is then utilized, for example, to control an etching process during which metal lines are formed on semiconductor substrate 120.

FIG. 2 is a plan view showing a portion of reticle 100 in which some of the masking material has melted and formed a bridge 130 across gap 115 between first line 111 and end 113A of second line 113. The present inventors have determined that long, narrow mask lines collect static charges during masking procedures, and that the static charges on adjacent mask lines induce opposite polarities. In loose mask patterns (i.e., mask pattern containing relatively few or widely disbursed mask structures), these opposite polarity charges can become significant, particularly at "T" intersections where perpendicular mask lines are separated by relatively small gaps. For example, referring to FIG. 2, first line 111 and second line 113 extend in perpendicular directions, and form a "T" intersection where the two lines are separated by a minimum distance (i.e., gap 115). According to electrostatic theory, opposite polarity charges 130(+) and 130(−) collect in a region 111A of first mask line 111 and end region 113A of second mask line 113, which are located on opposite sides of gap 115, and produces a rapid electrostatic discharge when the line-of-force density and air break down voltage between the metal lines reaches a critical condition. The electrostatic discharge generates high temperatures that can damage the glass plate of the reticle between the two metal lines, and can melt the metal mask pattern material to form a bridge 135 linking first line 111 to second line 113. When subsequently used in masking procedures, light transmission through the reticle is reduced by bridge 135, thereby producing an incorrect image on the underlying semiconductor substrate (e.g., substrate 120; see FIG. 1).

What is needed is a reticle that is modified to prevent bridging of the masking material between adjacent elongated mask lines, thereby facilitating the development of fabrication processes for increasingly large IC patterns.

It is known to add small square shaped dummy mask portions to a reticle in order to distribute charge more evenly across the reticle. But the preferred location and distance from the mask line has not been known.

SUMMARY

The present invention is directed to a reticle having two or more elongated mask lines that is modified to include a pattern of dummy mask portions that are arranged adjacent to and parallel to at least one of the elongated mask lines and located a critical distance away from the elongated mask lines. As mentioned above, mask material (e.g., chrome) is conductive, and elongated mask lines collect static charges during IC fabrication procedures. Further, opposite charges tend to concentrate at "T" intersections where perpendicular mask lines are separated by a relatively small gap, and produce bridging between the mask lines when these charges reach a critical state, resulting in electrostatic discharge (ESD) that generates high temperatures capable of locally melting the mask and its substrate materials. When close enough to the elongated mask lines, the dummy mask portions serve to balance (i.e., distribute) the charge over the length of the elongated lines, thereby reducing the concentration of opposite polarity charges at the "T" intersections, and reducing the possibility of ESD damage.

In accordance with a first aspect of the present invention, the plurality of dummy mask portions are located at a minimum distance from the elongated mask lines (i.e., equal to or shorter than the gap separating the two elongated lines at the "T" intersection). In one embodiment, each dummy mask portion is square and has sides that are equal to the critical feature dimension defined by the IC fabrication process, and is spaced from the elongated line segment by an offset distance that corresponds to the critical gap dimension defined by the IC fabrication process. In another embodiment, each dummy mask portion is a rectangular shaped mask line segment that is substantially shorter (smaller) than the elongated lines, and is aligned with and spaced from other mask line segments parallel to at least one of the elongated mask lines. Unlike the elongated mask lines, short dummy mask portions collect relatively small static charges that attract corresponding small amounts of the large static charge collected on the elongated mask line. By positioning dummy mask portions along a significant length of the mask lines and spacing the dummy mask portions a minimum distance from the mask lines, the larger static charges collected in the mask lines are balanced over a greater area, thereby limiting the voltage difference across gaps separating two adjacent mask lines.

In accordance with a second aspect of the present invention, the dummy mask portions may either be sub-resolution (i.e., smaller than the (critical) resolution value of the reticle), formed from transparent conductive material, or located on non-critical regions of the mask. Sub-resolution dummy mask portions don't cause transfer of the dummy mask image onto the underlying semiconductor substrate because they have widths that are smaller than the minimum resolution value for an exposure tool utilizing the reticle. Similarly, dummy mask portions formed from transparent conductive material (e.g., indium-tin oxide (ITO) or molybdenum silicide (MoSi)) are not transferred onto the underlying semiconductor substrate Alternatively, dummy portions larger than the critical resolution value may be located over non-critical regions of the semiconductor substrate (i.e., regions that can be easily removed or corrected during later fabrication steps, or regions in which the formation of isolated metal portions does not affect the underlying IC circuitry).

In one embodiment, the dummy mask portions. are long enough and close enough to the elongated mask lines to cooperate with the elongated mask lines to form a capacitor. The capacitor draws charge toward the gap between the two plates, and prevents accumulation of charge at a single point such as the T intersection discussed above. A single dummy mask line can be patterned to cooperate with two or more elongated mask lines to form two or more capacitors, again preventing charge buildup at a single point.

In another embodiment, a mask line arrangement forming a T intersection is modified so that the end of the mask line close to another mask line is curved to form a portion parallel to the other mask line, another way to distribute charge.

The present invention will be more fully understood in view of the following description and drawings.

DETAILED DESCRIPTION

The present invention is directed to a reticle having two or more elongated mask lines and a dummy mask pattern that includes dummy mask portions arranged adjacent to at least one of the elongated mask lines.

Figure 3:
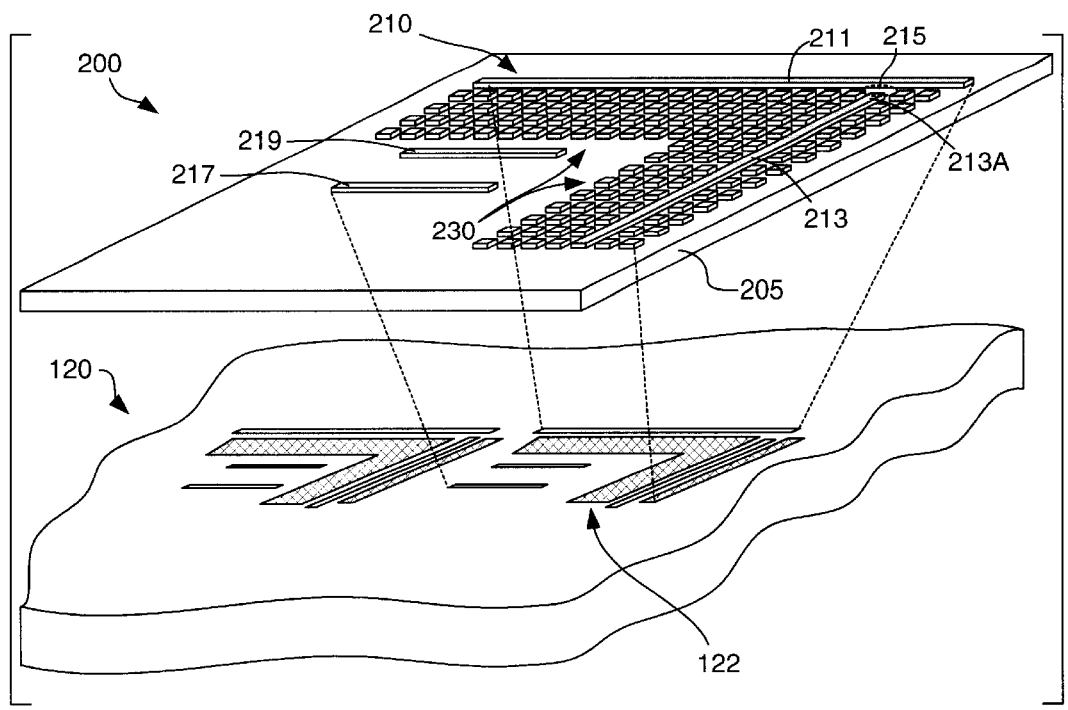
FIG. 3 is a perspective view showing a simplified reticle including dummy mask portions used in prior art structures.
Figure 4:
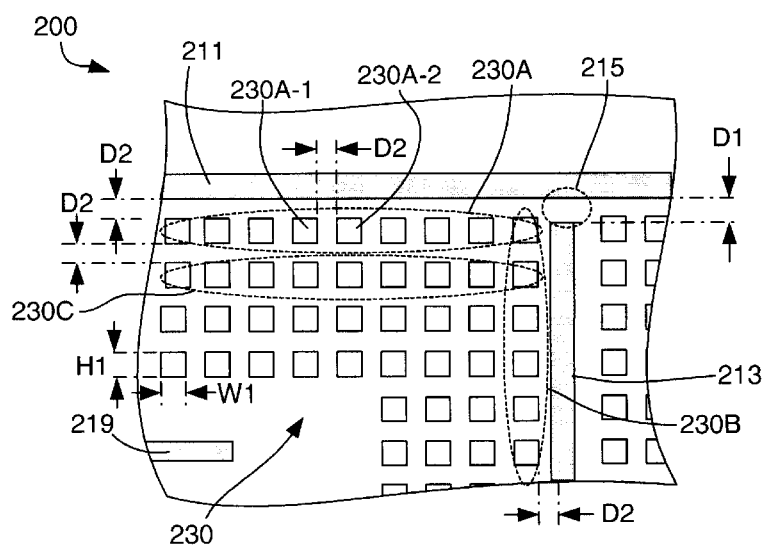
FIG. 4 is a plan view showing a portion of the simplified reticle shown in FIG. 3.
Figure 5:
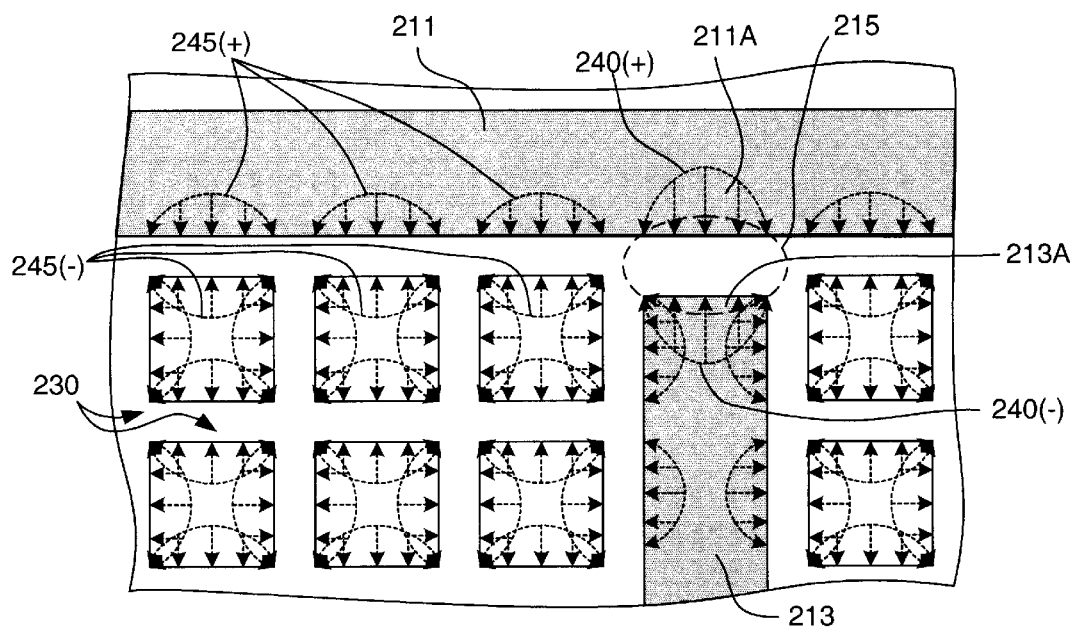
FIG. 5 is a plan view showing a portion of the reticle shown in FIG. 3 an illustrating charge distribution between the dummy mask portions and elongated lines.

In accordance with a first disclosed embodiment shown in FIGS. 3, 4 and 5, the dummy mask portions are depicted as square-shaped mask material portions that are arranged in parallel with and adjacent to the elongated mask line. These dummy mask portions are located a critical distance from the elongated mask lines, thus causing charge on the elongated mask lines to be distributed along their lengths.

Figure 6:
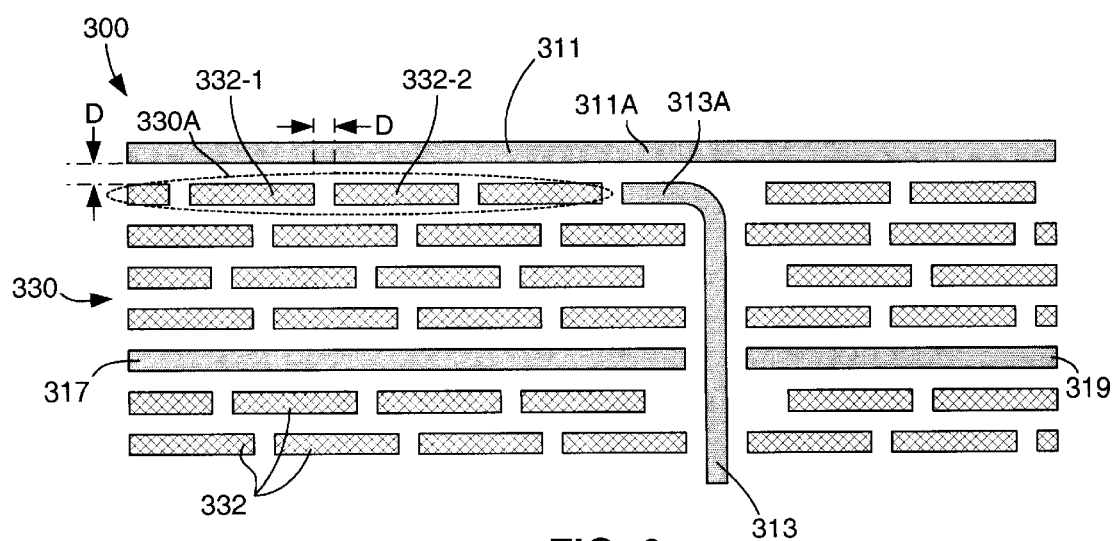
FIG. 6 is a plan view showing a portion of another reticle including a curved elongated mask line in combination with dummy mask portions formed in accordance with an embodiment of the present invention.

In accordance with a second disclosed embodiment shown in FIG. 6, the dummy mask portions are formed as rectangular shaped mask line segments that are aligned parallel with and positioned adjacent to the mask line. And one of the elongated mask lines includes a curved section ending in a short section parallel to another elongated mask line.

Figure 7:
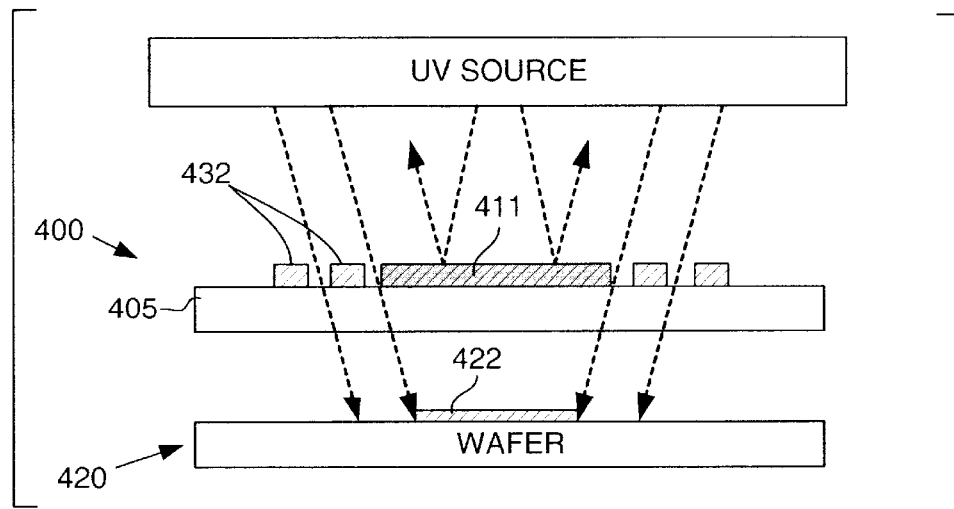
FIG. 7 is a side view showing a simplified reticle according to another embodiment of the present invention.

In accordance with a third disclosed embodiment shown in FIG. 7, the dummy mask portions may have a size that is smaller than the resolution value of the IC fabrication process.

Figure 8:
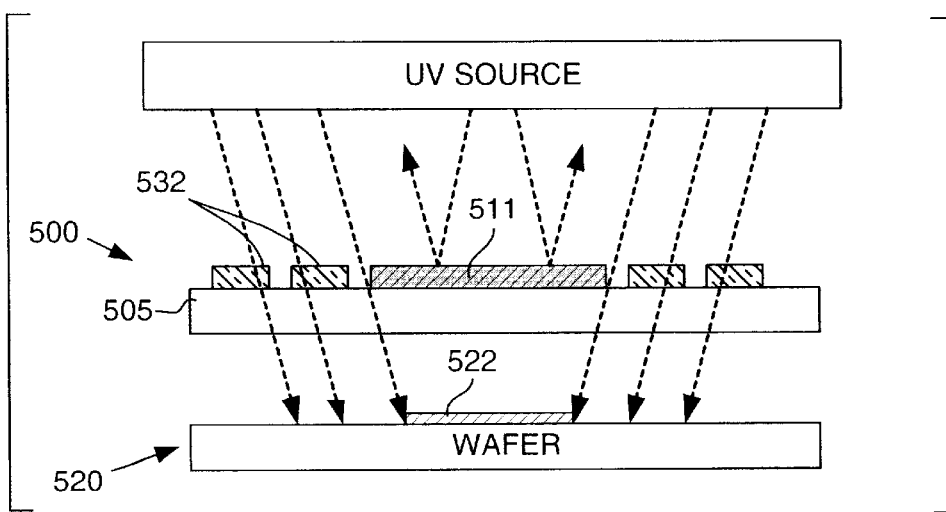
FIG. 8 is a side view showing a simplified reticle according to yet another embodiment of the present invention.

In accordance with a fourth disclosed embodiment shown in FIG. 8, the dummy mask portions may be formed from a transparent conductive material. In each of these embodiments, the size of each dummy mask portion is significantly smaller than that of the elongated mask line to be protected from ESD damage, thereby limiting the amount of static charge stored by each dummy mask portion. During fabrication operations, portions of the larger charge generated on the elongated line are attracted by the multiple smaller charges of the dummy mask portions located along its length. Accordingly, the static charge generated on the mask lines is distributed along the length of the mask lines, thereby reducing the amount of static charge located at, for example, "T" intersections with other mask lines and preventing ESD damage.

Figure 9:
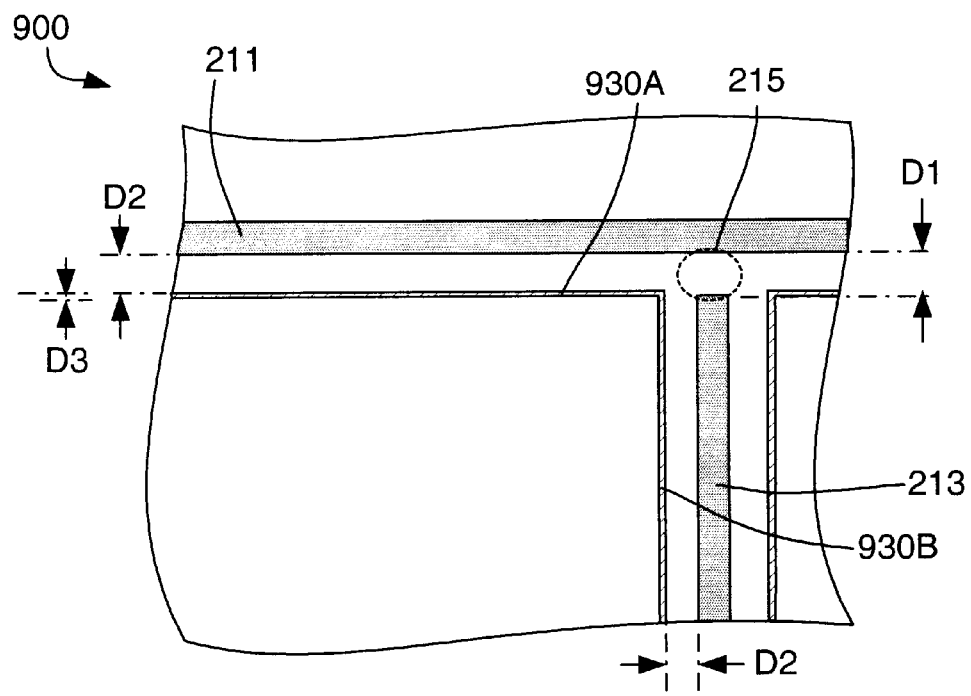
FIGS. 9 and 10 show additional embodiments of the invention using long dummy lines to cooperate with mask lines to form capacitors.
Figure 10:
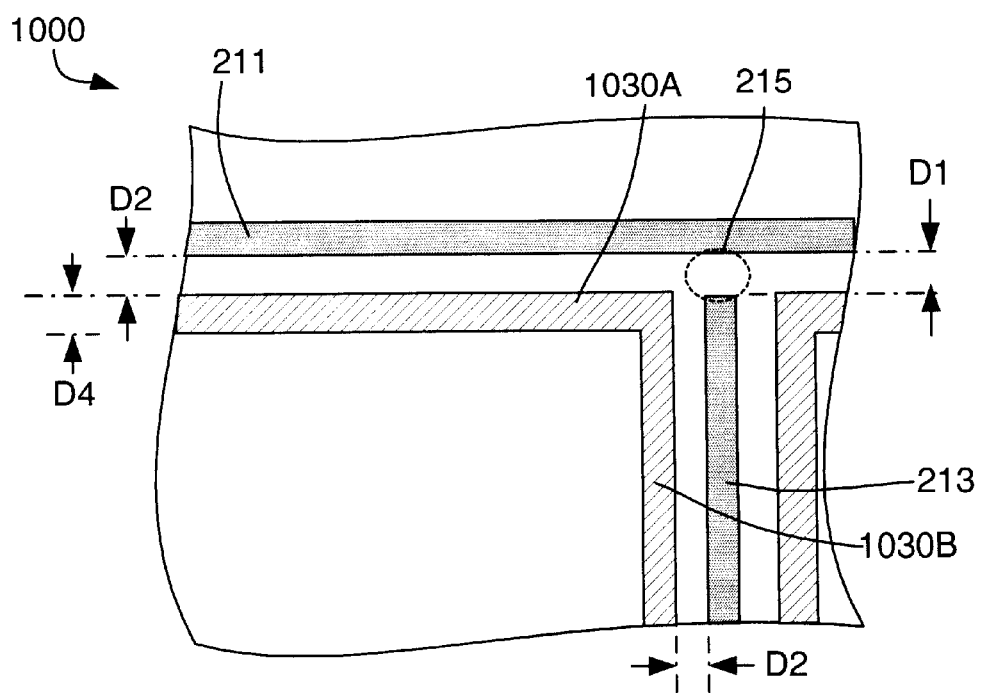

In accordance with fifth and sixth embodiments, shown in FIGS. 9 and 10, the dummy mask portions are long conductive lines forming capacitors in combination with the elongated mask lines. In FIG. 9, the dummy mask lines are smaller than the resolution of the process and do not form corresponding images on a wafer. In FIG. 10, the dummy lines are large enough to form images, and thus must be used where the images do not conflict with circuit structures.

As defined herein, the phrases "dummy mask pattern" and "dummy mask portion" refer to conductive portions that are intentionally formed on a reticle during an IC fabrication process but are not intended to form signal-carrying structures of an integrated circuit (IC). Signal-carrying structures are, for example, metal lines of the IC that conduct data or control signals transmitted during normal operation of the IC after fabrication, and are distinguished from, for example, isolated metal structures (i.e., metal structures completely surrounded by passivation material).

Figure 1:
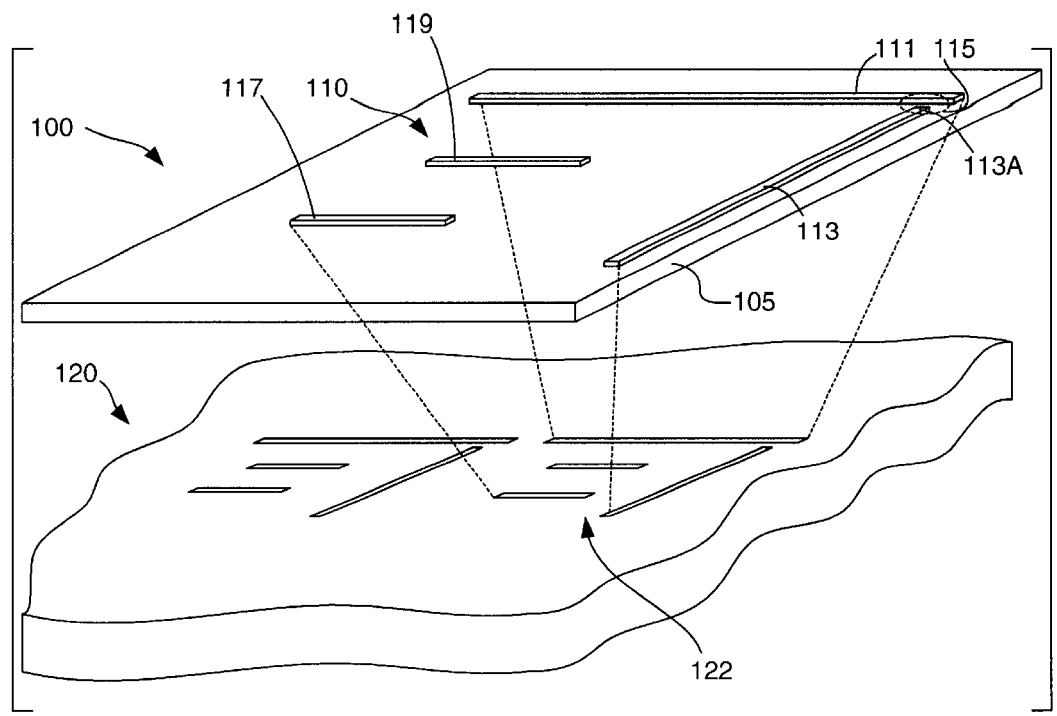
FIG. 1 is a perspective view showing a conventional reticle and a semiconductor substrate.
Figure 2:
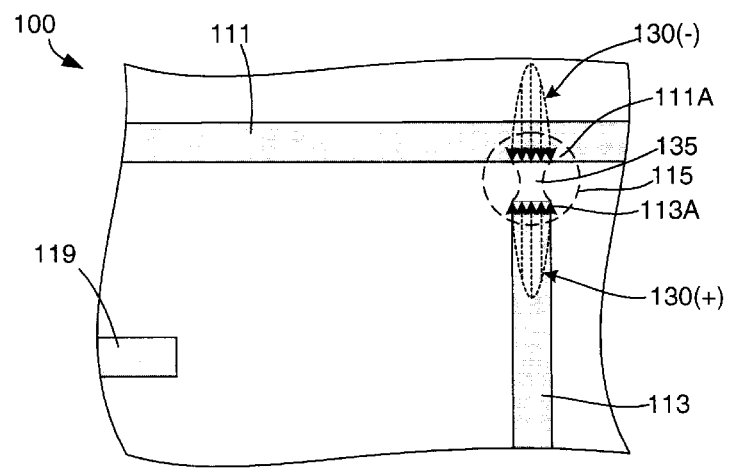
FIG. 2 is a plan view showing a portion of the conventional reticle after mask damage caused by ESD.

FIG. 3 is an exploded perspective view showing a reticle 200 formed in accordance with a first embodiment of the present invention. Reticle 200 includes a transparent substrate (e.g., quartz) 205 having a lithographic mask pattern 210 formed thereon. Mask pattern 210 is formed from a layer of opaque masking material (e.g., chrome) that is etched using known techniques. Similar to mask pattern 110 of conventional reticle 100 (see FIG. 1), mask pattern 210 includes a relatively long first line 211, a relatively long second line 213 that is perpendicular to first line 211, and zero or more additional structures (e.g., line segments 217 and 219) that are significantly separated from first mask line 211 and second mask line 213. Also shown in FIG. 3 is a semiconductor substrate 220 upon which lithographic mask pattern 222 is optically transferred during a lithographic step of an integrated circuit fabrication process. As in the conventional reticle shown in FIG. 1, first mask line 211 forms a "T" intersection with second mask line 213 such that an end 213A of second mask line 213 is separated from first mask line 211 by a gap 215.

More particularly, as shown in FIG. 4, end 213A of second mask line 213 is separated from first mask line 211 by a distance D1 at this intersection. Distance D1 corresponds to or is greater than a critical gap dimension defined by the IC fabrication process.

In the following description, the phrases "corresponds to a critical gap dimension" and "corresponds to a critical feature dimension" are used to describe the sizes of gaps and mask material portions, respectively, that are formed on a reticle. As discussed above, critical dimensions are defined by a particular IC fabrication process (e.g., a 0.18 um fabrication process requires a minimum gap spacing of 0.26 um between metal structures of the fabrication IC, and metal line widths of 0.22 um. Further, as discussed above, a lithographic process typically utilizes an optical reduction system such that image 222 formed on semiconductor substrate 220 is substantially smaller than (e.g., ¼) the size of lithographic mask pattern 210. Therefore, mask features are larger (e.g., 4 times larger for a ¼ reduction system) than the actual features formed on the semiconductor substrate. When a feature such as a metal line is formed that has a width equal to the critical feature dimension, the corresponding mask line has a width that is 4 times the critical feature dimension (e.g., 4 times 0.22 um, or 0.88 um). Similarly, when a gap between features is formed that has a width equal to the critical gap dimension, the corresponding gap between mask features has a width that is 4 times the critical feature dimension (e.g., 4 times 0.26 um, or 0.94 um). Accordingly, the phrases "corresponds to a critical gap dimension" and "corresponds to a critical feature dimension" are defined as having a size or spacing that will produce structures on the wafer that are separated by the critical dimension.

Referring to FIGS. 3 and 4, in accordance with the first embodiment, in addition to elongated mask lines 211 and 213, reticle 200 also includes a dummy mask pattern 230 made up of square-shaped, opaque, conductive dummy mask portions (e.g., chrome) that are aligned parallel to the lengths of mask line 211 and 213, and are separated from mask lines 211 and 213 by a critical distance D2. For example, dummy mask pattern 230 includes a first horizontal row 230A of dummy mask portions that are aligned in parallel with and separated by distance D2 from horizontal mask line 211, and a vertical row 230B of dummy mask portions that are aligned in parallel with and separated by distance D2 from vertical mask line 213. In accordance with one aspect of the present invention, distance D2 corresponds with the critical gap dimension of the selected IC fabrication process utilizing reticle 200. Accordingly, because distance D1 across gap 215 must be equal to or greater than the critical gap dimension, each dummy mask portion of first horizontal row 230A is separated from first mask line 215 by a distance that is equal to D1. As described below, the close spacing between mask lines 211 and 213 and dummy mask pattern 230 maximizes charge distribution along these mask lines, thereby minimizing the potentials that can cause bridging of the mask materials.

In accordance with another aspect of the invention, each row of dummy mask portions is separated from adjacent mask portions by the distance D2, which corresponds to the critical gap dimension. In addition, a second horizontal row 230C includes dummy mask portions that are separated from first horizontal row 230A by distance D2. As described below, the close spacing between dummy mask portions further maximizes charge distribution along mask lines 211 and 213.

Referring again to FIG. 4, each square-shaped dummy mask portion of dummy mask pattern 230 has a width W1 and a height H1 that corresponds with or is greater than the critical feature size (e.g., 0.4×0.4 um² for a 0.18 um fabrication process). Referring again to FIG. 3, as depicted by corresponding shaded regions of image 222, because each dummy mask portion of dummy mask pattern 230 is larger than the resolution value of the selected IC fabrication process, dummy mask pattern 230 generates a corresponding image pattern on semiconductor substrate 220. By locating the dummy mask portions over selected regions of semiconductor substrate 220, the corresponding structures (e.g., metal tiles) formed on semiconductor substrate remain isolated and do not disrupt the operation of the resulting integrated circuit. Alternatively, the corresponding structures (metal tiles) can be removed (e.g., etched) in process steps following the lithographic process utilizing reticle 200. In other embodiments, discussed below, dummy mask patterns are provided that do not generate corresponding structures on the underlying substrate.

In accordance with the present invention, unlike relatively long mask lines (e.g., first line 211 and second line 213), each dummy mask portion of dummy mask pattern 230 is only able to collect a relatively small static charge. By arranging dummy mask portions along the length of mask lines 211 and 213, these small static charges attract corresponding small portions of the large static charge collected on the adjacent mask line.

FIG. 5 is an enlarged plan view showing a portion of reticle 200 that illustrates in a simplified manner the charge distribution generated by dummy mask pattern 230. As mentioned above, by positioning multiple dummy mask portions along a significant length of mask lines 211 and 213, the larger static charges collected in the mask lines are distributed (balanced) over a greater area, thereby limiting the voltage difference across gap 215. As indicated in FIG. 5, according to electrostatic theory, opposite polarity charges 240(+) and 240(−) (indicated by arrows) collect in regions 211A and 213A on opposite sides of gap 215. Unlike the elongated mask lines, the dummy mask portions of dummy mask pattern 230 collect relatively small static charges 245(−) that attract corresponding small amounts 245(+) of the large static charge collected on mask line 211. By positioning multiple dummy mask portions along a significant length of mask line 211 and spacing the dummy mask portions at a minimum distance (e.g., corresponding to the critical gap dimension) from mask line 211, the larger static charge collected on mask line 211 is balanced over a greater area, thereby limiting static charge 245(+) across gap 215. Accordingly, the mask material bridging problem associated with conventional reticle 100 (discussed above) is avoided.

FIG. 6 is a plan view showing a portion of reticle 300 in accordance with a second embodiment of the present invention. Reticle 300 includes a first elongate mask line 311 that forms a "T" intersection with a second elongated mask line 313 such that a portion 311A of mask line 311 is located a distance D from an end portion 313A of mask line 313. End portion 313A runs parallel to elongated mask line 311 and serves to distribute charge caused by a voltage difference between lines 311 and 313. Reticle 300 also includes additional mask lines 317 and 319, and a dummy mask pattern 330. According to the second embodiment, dummy mask pattern 330 is made up of rectangular-shaped dummy mask line segments 332 (identified with crossing diagonal lines) that are substantially shorter (smaller) than elongated mask lines 311 and 313. As in the first embodiment (described above), dummy mask pattern 330 includes a first row 330A made up of dummy mask line segments that are separated from mask line 311 by distance D, which corresponds to the critical gap dimension defined by the IC fabrication process utilizing reticle 300. Similarly, each dummy mask line segment (e.g., segment 332-1) is spaced from its immediate adjacent neighboring dummy mask segments (e.g., segment 332-2) by distance D. As in the first embodiment (discussed above), each dummy mask line segment of dummy mask pattern 330 collects a relatively small static charge that attracts corresponding small amounts of the large static charge collected on elongated mask line 311. By positioning multiple dummy mask line segments along a significant length of mask line 311 and spacing the dummy mask portions a minimum distance D (e.g., the critical gap distance) from mask line 311, the larger static charge collected in mask lines 311 and 313 are balanced over a greater area, thereby limiting the voltage difference between any section of lines 311 and 313.

FIG. 7 is a side cross-sectional view showing a portion of a reticle 400 that is produced in accordance with a third embodiment of the present invention, and is located between a focused UV light source and a semiconductor substrate (wafer) 420. Formed on reticle 400 is an elongated line 411 that is similar to the elongated mask lines described above in the first and second embodiments. In accordance with the third embodiment, reticle 400 includes a dummy mask pattern made up entirely of sub-resolution dummy mask portions 432. As used herein, the term "sub-resolution" refers to a mask feature size that is less than the resolution value of an exposure tool utilized to form an IC during a fabrication process. FIG. 7 shows an image (shadow) portion 422 formed on semiconductor substrate 420 that is optically transferred from a portion of reticle 400 that includes sub-resolution dummy mask portions 432. As indicated in FIG. 7, due to the small width of dummy mask portions 432, no image is formed on semiconductor substrate 420 that corresponds with sub-resolution dummy mask portions 432. Similarly, none of the other sub-resolution features (not shown) incorporated into dummy mask pattern 430 are optically transferred onto semiconductor substrate 420. As in the first and second embodiments (discussed above), each dummy mask portion 432 collects a relatively small static charge that attracts corresponding small amounts of the large static charge collected on elongated mask line 411. By positioning multiple sub-resolution dummy mask portions along a significant length of mask line 411, the larger static charge collected in mask line 411 is distributed over a greater area, thereby limiting the voltage difference across the separating mask line 411 from another elongated mask line (not shown).

FIG. 8 is a side cross-sectional view of a portion of a reticle 500 that is produced in accordance with a fourth embodiment of the present invention, and is located between a focused UV light source and a semiconductor substrate (wafer) 520. Formed on reticle 500 is an elongated opaque mask line 511 that is similar to the elongated mask lines described above in the first and second embodiments. In accordance with the fourth embodiment, reticle 500 includes a dummy mask pattern made up entirely of dummy mask portions 532 formed from a transparent, conductive material. An image (shadow) portion 522 formed on semiconductor substrate 520 is optically transferred from reticle 500. However, no image of dummy mask portions 532 is transferred to wafer 520. This principle can be applied with conductive, transparent masks made of molybdenum silicide (MoSi) or indium-tin oxide (ITO). However, as in the first and second embodiments (discussed above), due to their conductivity, each dummy mask portion 532 collects a relatively small static charge that attracts corresponding small amounts of the large static charge collected on elongated mask line 511. By positioning multiple transparent conductive dummy mask portions 532 along a significant length of mask line 511, the larger static charge collected in mask line 511 is distributed over a greater area, thereby limiting the voltage difference across the separating mask line 511 that might discharge to another elongated mask line (not shown).

In addition to the specific embodiments disclosed herein, other modifications to conventional reticles are also possible that fall within the spirit and scope of the present invention. Therefore, the invention is limited only by the following claims.

What is claimed is:

1. A reticle for optically forming an image on a semiconductor wafer during an integrated circuit fabrication process, the reticle comprising:

a transparent substrate;

a lithographic mask pattern formed on a surface of the transparent substrate, the lithographic mask pattern including an elongated first mask line aligned in a first direction, and an elongated second mask line aligned in a second direction and having an end that is separated from the first line by a first distance; and a dummy mask pattern including a first plurality of dummy mask portions arranged in a line that is parallel to the first mask line, wherein each dummy mask portion of the first plurality of dummy mask portions is separated from the first mask line by a second distance that is equal to or less than the first distance but not smaller than the critical gap dimension, and wherein each dummy mask portion of the first plurality of dummy mask portions is electrically isolated from all other dummy mask portions of the first plurality of dummy mask portions and all mask lines of the lithographic mask pattern.

2. The reticle according to claim 1, wherein each dummy mask portion of the dummy mask pattern comprises a square shape.

3. The reticle according to claim 2, wherein the integrated circuit fabrication process defines a critical feature dimension, and wherein each side of the square shape has a length that corresponds to the critical feature dimension.

4. The reticle according to claim 1, wherein each dummy mask portion of the dummy mask pattern comprises a rectangular shape.

5. The reticle according to claim 1, wherein the integrated circuit fabrication process defines a critical gap dimension, and wherein the second distance corresponds to the critical gap dimension.

6. The reticle according to claim 1, wherein the first plurality of dummy mask portions comprise a first dummy mask portion separated from a second dummy mask portion by the second distance.

7. The reticle according to claim 1, wherein each dummy mask portion of the dummy mask pattern includes a width that is smaller than a resolution value defined by the integrated circuit fabrication process.

8. The reticle according to claim 1, wherein each dummy mask portion comprises a transparent conductive material.

9. The reticle according to claim 8, wherein each of the dummy mask portions comprises Indium-Tin Oxide.

10. The reticle according to claim 8, wherein each of the dummy mask portions comprises molybdenum-silicide.

11. A reticle for optically transferring a lithographic mask pattern onto a semiconductor substrate during an integrated circuit fabrication process, the reticle comprising:

a transparent substrate; and a lithographic mask pattern formed on a surface of the transparent substrate, the lithographic mask pattern including an elongated mask line; and a dummy mask pattern including a first plurality of dummy mask portions arranged parallel to the mask line, wherein the integrated circuit fabrication process defines a critical gap dimension, and wherein each dummy mask portion of the first plurality of dummy mask portions is separated from the mask line by an offset distance that corresponds to the critical gap dimension, and wherein each dummy mask portion of the first plurality of dummy mask portions is electrically isolated from all other dummy mask portions of the first plurality of dummy mask portions and all mask lines of the lithographic mask pattern.

12. The reticle according to claim 11, wherein each dummy mask portion of the dummy mask pattern comprises a square shape.

13. The reticle according to claim 11, wherein each dummy mask portion of the dummy mask pattern comprises a retangular shape.

14. The reticle according to claim 11, wherein the first plurality of dummy mask portions comprise a first dummy mask portion separated from a second dummy mask portion by the offset distance.

15. The reticle according to claim 11, wherein each dummy mask portion of the dummy mask pattern includes a width that is smaller than a resolution value defined by the integrated circuit fabrication process.

16. The reticle according to claim 11, wherein each dummy mask portion comprises a transparent conductive material.

17. The reticle according to claim 16, wherein each of the dummy mask portions comprises indium-tin oxide.

18. The reticle according to claim 16, wherein each of the dummy mask portions comprises molybdenum-silicide.

19. A method for optically transferring a lithographic mask pattern from a reticle onto a semiconductor substrate in accordance with an integrated circuit fabrication process defining a critical dimension, the method comprising:

forming the reticle such that the lithographic mask pattern includes a first mask line and a dummy mask pattern, the dummy mask pattern including a first plurality of dummy mask portions arranged parallel to the mask line, wherein each dummy mask portion of the first plurality of dummy mask portions is separated from the mask line by an offset distance that corresponds to the critical dimension of the integrated circuit fabrication process and wherein each dummy mask portion of the first plurality of dummy mask portions is electrically isolated from all other dummy mask portions of the first plurality of dummy mask portions and all mask lines of the lithographic mask pattern; and transferring an image of the lithographic mask pattern onto the semiconductor substrate during the integrated circuit fabrication process to form a line on the semiconductor substrate that corresponds with the mask line.

20. The method according to claim 19, wherein each dummy mask portion of the dummy mask pattern has a square shape, and wherein each side of the square shape has a length that corresponds to a critical feature dimension defined by the integrated circuit fabrication process.

21. A reticle for forming a pattern on an integrated circuit device comprising:

a transparent substrate; and an opaque layer patterned to include:
- an elongated opaque line; and
- a dummy mask pattern positioned close enough to the elongated opaque line to attract charge present on the elongated opaque line,
- wherein the dummy mask pattern includes a plurality of dummy mask portions arranged such that each of the dummy mask portions is electrically isolated from all other dummy mask portions of the dummy mask pattern and all other portions of the opaque layer.

22. The reticle of claim 21 wherein the dummy mask pattern works with the elongated opaque line to form a capacitor.

23. The reticle of claim 21 wherein the dummy mask pattern is opaque.

24. The reticle of claim 21 wherein the dummy mask pattern is transparent.

25. The reticle of claim 21 wherein the dummy mask pattern is sufficiently thin as to be within the resolution of a beam that patterns the integrated circuit device and therefore forms no pattern on the integrated circuit device.

26. The reticle of claim 21 wherein the dummy mask pattern is sufficiently wide to form a pattern on the integrated circuit device.

27. The reticle of claim 21 wherein the elongated opaque line comprises a pair of elongated opaque lines arranged such that the end of one elongated opaque line of the pair is close to a side of the other elongated opaque line of the pair.

28. The reticle of claim 27 wherein the dummy mask pattern works with the pair of elongated opaque lines to form a plurality of capacitors.

* * * * *